United States Patent
Wang et al.

(10) Patent No.: US 11,249,340 B2
(45) Date of Patent: Feb. 15, 2022

(54) DISPLAY SUBSTRATE, DISPLAY PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yangpeng Wang, Beijing (CN); Haijun Qiu, Beijing (CN); Benlian Wang, Beijing (CN); Yuedi He, Beijing (CN); Weinan Dai, Beijing (CN); Jingyi Feng, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 346 days.

(21) Appl. No.: 16/552,285

(22) Filed: Aug. 27, 2019

(65) Prior Publication Data
US 2020/0225535 A1    Jul. 16, 2020

(30) Foreign Application Priority Data

Jan. 11, 2019  (CN) .......................... 201910026813.0

(51) Int. Cl.
*G02F 1/1335* (2006.01)
*H01L 27/32* (2006.01)

(52) U.S. Cl.
CPC .... *G02F 1/133553* (2013.01); *H01L 27/3234* (2013.01)

(58) Field of Classification Search
CPC ......... G02F 1/133553; G02F 1/133562; G02F 1/1335; H01L 27/3234; H01L 51/5275
See application file for complete search history.

(56) References Cited

U.S. PATENT DOCUMENTS

2018/0113320 A1* 4/2018 Lee .................... H01L 27/3293

\* cited by examiner

*Primary Examiner* — Donald L Raleigh
(74) *Attorney, Agent, or Firm* — Dilworth & Barrese, LLP.; Michael J. Musella, Esq.

(57) ABSTRACT

A display substrate, a display panel, and a display device are provided. The display substrate includes a transparent region and a pixel display region surrounding at least a portion of the transparent region. The display substrate includes a base substrate and a first optical layer located on the base substrate, the first optical layer is located within the pixel display region. A portion of the first optical layer close to the transparent region includes a first light ray deflection part configured to deflect image light of the pixel display region around the transparent region toward the transparent region for displaying in the transparent region.

16 Claims, 4 Drawing Sheets

DISPLAY SUBSTRATE, DISPLAY PANEL AND DISPLAY DEVICE

The present application claims priority to Chinese patent application No. 201910026813.0, filed on Jan. 11, 2019, the entire disclosure of which is incorporated herein by reference as part of the present application.

TECHNICAL FIELD

At least one embodiment of the present disclosure relates to a display substrate, a display panel, and a display device.

BACKGROUND

Nowadays, a concept of a full-screen cell phone has drawn extensive attention in a cell phone market, and is also a development direction of the cell phone in the future. In the full-screen cell phone, a camera can be hidden so that a front-side visual area is almost full of screens, thereby a user obtaining a better display effect.

SUMMARY

At least one embodiment of the present disclosure relates to a display substrate, a display panel, and a display device.

At least one embodiment of the present disclosure provides a display substrate, including a transparent region and a pixel display region surrounding at least a portion of the transparent region, the display substrate including a base substrate and a first optical layer located on the base substrate, the first optical layer being located within the pixel display region. A portion of the first optical layer close to the transparent region comprises a first light ray deflection part configured to deflect image light of the pixel display region around the transparent region toward the transparent region for displaying in the transparent region.

For example, the display substrate also includes a pixel unit disposed on the base substrate and located in the pixel display region. The first optical layer is located at a light exit side of the pixel unit.

For example, in a direction parallel to the base substrate and from a position away from the transparent region to the position close to the transparent region, a thickness of the first light ray deflection part gradually increases, and a side of the first light ray deflection part away from the pixel unit is filled with a medium having a smaller refractive index than that of the first light ray deflection part.

For example, the first optical layer also includes at least one second light ray deflection part located at a side of the first light ray deflection part away from the transparent region, and in a direction parallel to the base substrate and from a position away from the transparent region to a position close to the transparent region, a thickness of the second light ray deflection part gradually increases, and a side of the second light ray deflection part away from the pixel unit is filled with a medium having a smaller refractive index than that of the second light ray deflection part.

For example, a cross-sectional shape of the second light ray deflection part taken by a plane perpendicular to the base substrate is the same as a cross-sectional shape of the first light ray deflection part taken by the plane.

For example, in a direction parallel to the base substrate and from a position away from the transparent region to a position close to the transparent region, a thickness of the first light ray deflection part gradually decreases; the display substrate further includes a second optical layer attached on a surface of a side of the first light ray deflection part away from the pixel unit, and a refractive index of the second optical layer is greater than that of the first light ray deflection part.

For example, a surface of a side of the second optical layer away from the first light ray deflection part is provided with a medium having a smaller refractive index than that of the second optical layer.

For example, in a direction parallel to the base substrate and from a position away from the transparent region to the position close to the transparent region, a thickness of a portion of the first optical layer apart from the first light ray deflection part gradually decreases.

For example, a surface of the side of the first light ray deflection part away from the pixel unit has a straight-line or curved-line shape in a cross-section taken by a plane perpendicular to the base substrate.

For example, the pixel unit comprises a light emitting layer and an encapsulation layer located between the first optical layer and the light emitting layer.

For example, a position of the base substrate directly facing with the transparent region in a direction perpendicular to the base substrate comprises a through-hole.

For example, the base substrate is a transparent substrate.

For example, the display substrate is an array substrate or a color filter substrate.

For example, the display substrate is a cover glass, the base substrate includes a groove, and the first optical layer is located within the groove; in a direction parallel to the base substrate and from a position away from the transparent region to a position close to the transparent region, a thickness of the first light ray deflection part gradually decreases; a refractive index of the base substrate is greater than that of the first light ray deflection part, and the base substrate located at a light exit side of the first optical layer.

For example, a surface of a side of the first optical layer away from the base substrate is flush with a surface of the base substrate.

At least one embodiment of the present disclosure provides a display panel including the aforementioned display substrate. A position of the display panel directly facing with the transparent region in a direction perpendicular to the base substrate is transparent.

At least one embodiment of the present disclosure provides a display device including the aforementioned display panel, and a functional component located in the transparent region and located at a side opposite to a light exit side of the display panel.

For example, the functional component includes at least one selected from the group consisting of a camera module, a 3D structured light module, a time-of-flight 3D imaging module, and an infrared sensing module.

BRIEF DESCRIPTION OF THE DRAWINGS

In order to more clearly illustrate technical solutions of embodiments of the present disclosure, drawings of the embodiments will be briefly described in the following. It is obvious that the described drawings in the following description are only related to some embodiments of the present disclosure, but are not limitative to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

In a study, the inventor of the present application found that in order to achieve a full-screen design, a through-hole can be disposed in a display device, and a camera can be placed in a hole region to realize hiding of the camera. However, the through-hole for placing the camera may cause the hole region to be unable to display when a display screen displays images, thereby producing visually black spots for influencing user experience.

An embodiment of the present disclosure provides a display substrate, including a transparent region and a pixel display region surrounding at least a portion of the transparent region. The display substrate includes a base substrate and a first optical layer located on the base substrate, the first optical layer is located within the pixel display region. A portion of the first optical layer close to the transparent region includes a first light ray deflection part configured to deflect image light of the pixel display region around the transparent region toward the transparent region for displaying in the transparent region. Images can be displayed in the transparent region by using the display substrate provided by the embodiment of the present disclosure, so as to maintain display integrity of the entire display substrate.

A display substrate, a display panel, and a display device provided by embodiments of the present disclosure are described below with reference to the drawings.

Figure 1A:
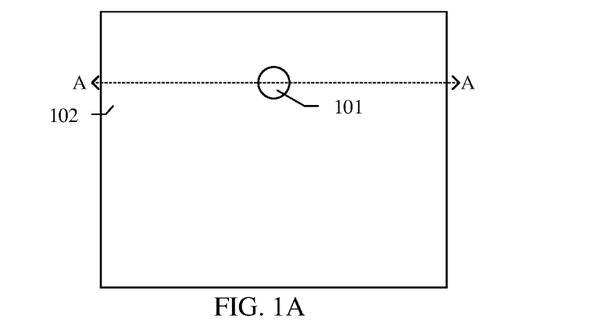
FIG. 1A and FIG. 1B are partial structural diagrams of a display substrate provided by an example of an embodiment of the present disclosure.
Figure 1B:
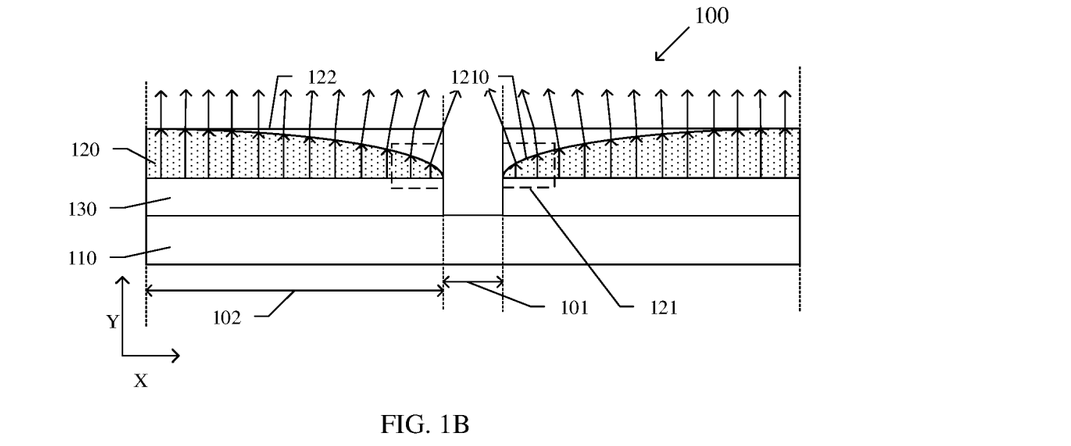

At least one embodiment of the present disclosure provides a display substrate. FIG. 1A and FIG. 1B are partial structural diagrams of a display substrate provided by an example of an embodiment of the present disclosure, FIG. 1B is a partial cross-sectional diagram of the display substrate shown in FIG. 1A taken along line AA. As shown in FIGS. 1A and 1B, the display substrate 100 includes a transparent region 101 and a pixel display region 102 surrounding at least a portion of the transparent region 101. FIG. 1A takes an example that the pixel display region 102 surrounds the entire transparent region 101, but is not limited thereto, and the pixel display region can also surround a portion of the transparent region. The display substrate 100 includes a base substrate 110 and a first optical layer 120 located on the base substrate 110, the first optical layer 120 is located within the pixel display region 102, and the present embodiment takes an example that the transparent region 101 does not include the first optical layer 102. A portion of the first optical layer 120 close to the transparent region 101 includes a first light ray deflection part 121 configured to deflect image light of the pixel display region 102 around the transparent region 101 toward the transparent region 101 for displaying in the transparent region 101.

For example, as shown in FIG. 1B, a second optical layer 122 is disposed on a surface of a side of the first light ray deflection part 121 away from the base substrate 110, the second optical layer 122 is completely attached on a surface of the first light ray deflection part 121, and a refractive index of the second optical layer 122 is greater than that of the first light ray deflection part 121. In a direction parallel to the base substrate 110 and from a position away from the transparent region 101 to a position close to the transparent region 101, a thickness of the first light ray deflection part 121 gradually becomes smaller, and a thickness of the second optical layer 122 gradually increases.

The present embodiment is not limited to the thickness of the second optical layer being gradually increased, as long as the image light emitted from the first light ray deflection part is deflected toward the transparent region after passing through the second optical layer.

For example, a side of the second optical layer 122 away from the first light ray deflection part 121 may be an air layer, and a refractive index of the air layer is smaller than a refractive index of the second optical layer 122, so that light rays emitted from the second optical layer 122 enable to be further deflected toward the transparent region 101.

Figure 1C:
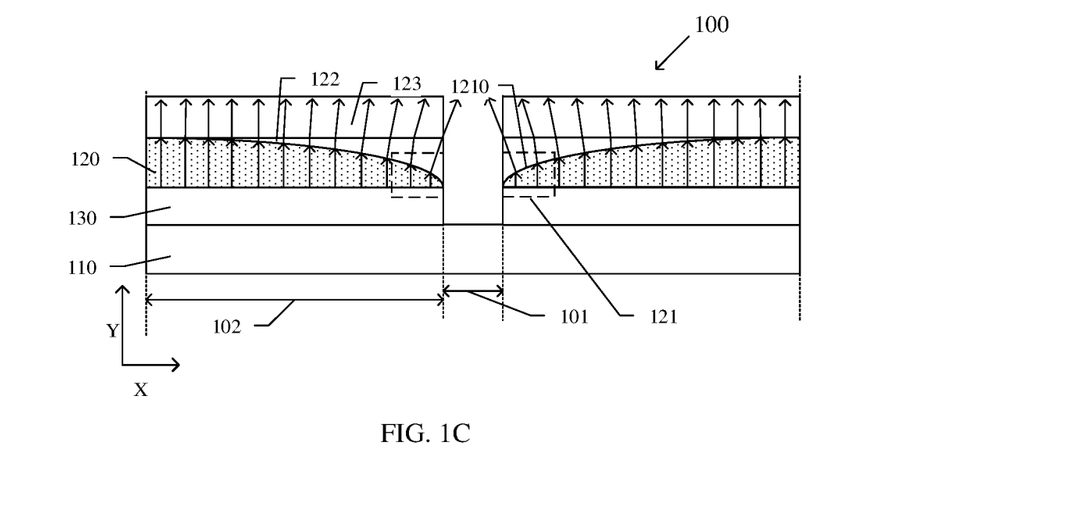
FIG. 1C is a partial structural diagram of a display substrate provided by another example of an embodiment of the present disclosure.

The embodiment of the present disclosure is not limited thereto. For example, as shown in FIG. 1C, a medium 123 having a smaller refractive index than that of the second optical layer 122 may be disposed on a surface of the side of the second optical layer 122 away from the first light ray deflection part 121, so that the light rays emitted from the second optical layer 122 enable to be further deflected toward the transparent region 101.

The present embodiment takes an example that the first light ray deflection part is an inclination part having a gradually decreased thickness in the direction parallel to the base substrate and from a position away from the transparent region to a position close to the transparent region, but is not limited thereto, and the first light ray deflection part also may be other components that can deflect light.

For example, as shown in FIG. 1B, in this example, the display substrate 100 can be an array substrate or a color filter substrate. The array substrate can be as an array substrate for an organic light emitting diode, and also as an array substrate for a liquid crystal display panel.

For example, as shown in FIG. 1B, the display substrate 100 also includes a pixel unit 130 disposed on the base substrate 110 and located in the pixel display region 102. FIG. 1B schematically shows a pixel unit 130 located between the first optical layer 120 and the display substrate 100, but is not limited thereto, as long as the first optical layer is located at a light exit side of the pixel unit. In an embodiment of the present disclosure, the pixel unit is only disposed in the pixel display region, i.e., not disposed in the base substrate of the transparent region, and thus a region having the pixel unit is the pixel display region.

Generally, in a display substrate without the first optical layer and the second optical layer, because the transparent region is not provided with the pixel unit, when the display substrate is used for displaying images, almost all image light of the pixel unit is emitted from the pixel display region to realize the display of pictures, while the transparent region emits no light ray, thereby generating visually black spots and affecting the display effect.

In the display substrate provided in the present embodiment, because the position of the first optical layer close to the transparent region includes the first light ray deflection part, the image light displayed in the pixel display region, after being incident on the first light ray deflection part and the second optical layer, is deflected toward the transparent region for displaying in the transparent region by means of cooperation of the first light ray deflection part with the second optical layer. That is to say, an original light path of the image light emitted from the pixel unit is changed after the image light passing through the first light ray deflection part of the first optical layer and the second optical layer, and at least a portion of the image light whose light path is changed exits from the transparent region, and the display integrity of the entire display substrate is realized by displaying at a position of an original visual black spot.

For example, assuming that image light of a pixel unit closest to the transparent region does not pass through the first light ray deflection part and the second optical layer, the pixel unit may display at an edge of the pixel display region close to the transparent region. While after the image light of the pixel unit is deflected to the transparent region by the first light ray deflection part and the second optical layer, the pixel unit displays in the transparent region, i.e., the first light ray deflection part and the second optical layer deflect the image light displayed at the edge of the pixel display region close to the transparent region into the transparent region. In the present embodiment, the number of pixel units displayed in the transparent region is not limited, as long as the display integrity of the entire display substrate can be achieved.

For example, as shown in FIG. 1B, in a direction parallel to the base substrate 110 and from a position away from the transparent region 101 to a position close to the transparent region 101, a thickness of the first optical layer 120 apart from the first light ray deflection part 121 gradually becomes smaller, and thereby decreasing a display difference between the pixel display region 102 and the transparent region 101. In this case, in the direction parallel to the base substrate 110 and from the position away from the transparent region 101 to the position close to the transparent region 101, a thickness of a rest portion of the second optical layer 122 apart from a portion located on the first light ray deflection part 121 gradually increases, i.e., the second optical layer 122 and the first optical layer 120 are complementary in shape. That is to say, in a case where a partial surface of the first optical layer away from the base substrate is not parallel with a main plane of the base substrate, the image light emitted from the pixel unit can be incident from the partial surface of the first optical layer into the second optical layer, and by means of cooperation of the first optical layer with the second optical layer, the image light can be deflected to a direction close to the transparent region.

For example, upon image light of a first partial of the pixel units close to the transparent region being deflected into the transparent region for displaying, although a second partial of the pixel units near the first partial of pixel units are still displayed in the pixel display region, a light path of image light of the second partial of the pixel units is also changed by portions of the first optical layer apart from the first light ray deflection part and deflected to the direction close to the transparent region, therefore, the image light emitted from the first optical layer is distributed more uniformly to reduce the display difference between the pixel display region and the transparent region.

The present embodiment (which includes the above and below described examples) is not restricted in that the thickness of the portion of the first optical layer apart from the first light ray deflection part is gradually variable, the thickness of the portion of the first optical layer apart from the first light ray deflection part also may be equal, i.e., the first optical layer includes the first light ray deflection part, and a flat part located at a side of the first light ray deflection part away from the transparent region, in this case, the second optical layer is only disposed on the first light ray deflection part.

For example, as shown in FIG. 1B, a surface of a side of the first light ray deflection part 121 away from the pixel unit 130, such as an inclination plane 1210, has a curve-line shape in a cross-section taken by a plane (taking a plane parallel to an XY plane as an example in the figure) perpendicular to the base substrate 110, and the curve-line bends toward a side close to the transparent region 101, meanwhile the inclination plane 1210 is an arc-shaped plane. The inclination plane of the first light ray deflection part is designed as an arc-shaped plane, and the arc-shaped plane bends toward a side close to the transparent region, so that the image light emitted from the inclination plane can be uniformly distributed.

Figure 2:
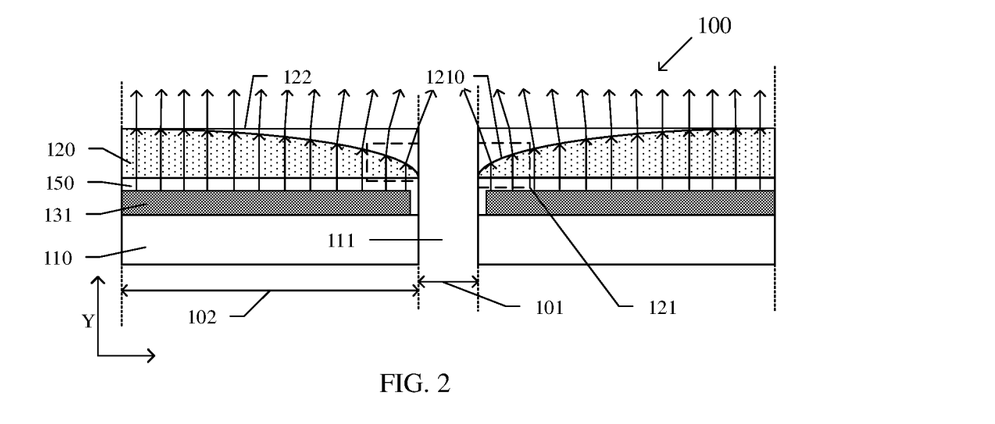
FIG. 2 is a partial cross-section structural diagram of a display substrate provided by another example of an embodiment of the present disclosure.

For example, FIG. 2 is a partial cross-section structural diagram of a display substrate provided by another example of the embodiment. As shown in FIG. 2, the display substrate 100 in this example is an array substrate of an organic light emitting diode, the pixel unit includes a light emitting layer 131, and light emitted by a portion of the light emitting layer 131 close to the transparent region 101 exits from the transparent region 101 after passing through the first light ray deflection part 121 and the second optical layer 122, i.e., after the light emitted by the portion of the light emitting layer 131 close to the transparent region 101 passes through the first light ray deflection part 121 and the second optical layer 122, a light path of the light is changed, and the light is deflected to the transparent region 101 for displaying in the transparent region 101.

For example, as shown in FIG. 2, an orthographic projection of the light emitting layer 131 on the base substrate 110 completely falls within an orthographic projection of the first optical layer 120 on the base substrate 110, i.e., the light emitted by the light emitting layer 131 exits after passing through the first optical layer 120, thereby reducing the display difference between the pixel display region 102 and the transparent region 101. The present embodiment is not limited thereto, and the orthographic projection of the light emitting layer on the base substrate may partially fall into the orthographic projection of the first optical layer on the base substrate, as long as the light emitted by the light emitting layer located around the transparent region exits from the transparent region after passing through the first light ray deflection part and the second optical layer, and the display integrity of the entire display substrate is realized by displaying at a position of an original visual black spot.

For example, in the direction perpendicular to the base substrate, the pixel unit also includes a cathode and an anode located on both sides of the light emitting layer, a hole injection layer and a hole transport layer between the anode and the light emitting layer, and an electron injection layer and an electron transfer layer located between the cathode and the light emitting layer and other film layers (not shown).

For example, as shown in FIG. 2, the display substrate 100 also includes an encapsulation layer 150 located between the first optical layer 120 and the light emitting layer 131. The encapsulation layer 150 is used to encapsulate the light emitting layer 131 and prevent film layers such as the light emitting layer 131 and the like from being eroded by external water and oxygen. In the present embodiment of the present disclosure, the original fabrication process of the array substrate of the original organic light emitting diode is not changed, and the first optical layer is added after the packaging of the general array substrate including the transparent region is completed, thereby facilitating the fabrication.

For example, before the first optical layer is disposed, a thin film transistor can be fabricated on the base substrate by a photolithography process, then the light emitting layer is fabricated by evaporation, printing, or spin coating, and finally packaging is performed to complete the fabrication process of the general display substrate. For example, the above-mentioned film layers may be sequentially patterned in a process of forming the light emitting layer and the encapsulation layer, to form a through-hole corresponding to the transparent region.

In the present embodiment, after the packaging process, the second optical layer and the first optical layer including the first light ray deflection part are fabricated on the encapsulation layer using an etching process.

For example, the process of fabricating the display substrate can further include that before forming the first optical layer, the light emitting layer and the encapsulation layer are not patterned to form the through-hole; after the first optical layer is patterned to form the first light ray deflection part, the second optical layer is formed on the first optical layer; then all of the film layers corresponding to the transparent region are patterned to form the through-hole corresponding to the transparent region. It should be noted that the patterned second optical layer is located at least on the first light ray deflection part.

For example, a material of the first optical layer includes a transparent inorganic material or a transparent organic material. For example, the inorganic material may include silicon nitride, silicon oxide, or the like, and the organic material may include polyimide, polymethyl methacrylate and the like, which is not limited thereto in the present embodiment.

In the present embodiment, the first optical layer is not limited to be fabricated using the etching process, and the first optical layer including the first light ray deflection part may also be attached on the encapsulation layer using an attaching manner, and the first optical layer can include a prism structure, whose material, for example, employs a material such as glass or transparent plastic. Similarly, the second optical layer can also be attached on the first light ray deflection part using the attaching manner. The second optical layer should employ a material having a refractive index greater than that of the first optical layer.

For example, as shown in FIG. 2, a position of the base substrate 110 directly facing with the transparent region 101 in a direction perpendicular to the base substrate 110 includes a through-hole 111.

For example, after the first optical layer and the second optical layer are fabricated on the encapsulation layer, the base substrate may be cut using manners such as a laser or a cutting wheel to form the through-hole at a position directly facing the transparent region. For example, in a case where the display substrate is formed into a display device through subsequent fabrication processes, the through-hole directly faces with a structure such as a camera module or the like, or the through-hole is used for placing the structure such as a camera module or the like, so that external ambient light enables to be incident into the structure such as a camera module or the like through the through-hole.

The embodiment is not limited thereto, for example, the base substrate may be a transparent substrate. In a case where the transparent substrate can maintain good transmission, the position of the base substrate directly facing with the transparent region may not be provided with a through-hole. For example, when the display substrate is formed into a display device by subsequent fabrication processes, the camera module is located at a side of the base substrate away from the light emitting layer and located in the transparent region, as long as the external ambient light can be incident into the camera module through the transparent base substrate.

Figure 3A:
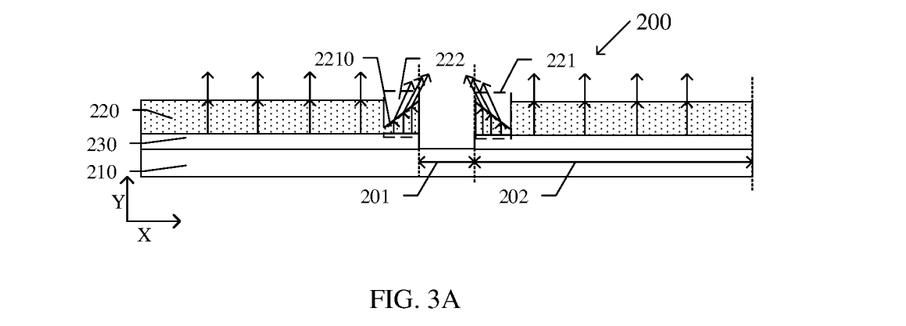
FIG. 3A is a partial cross-section structural diagram of a display substrate provided by an example of another embodiment of the present disclosure.

FIG. 3A is partial cross-section structural diagram of a display substrate provided by an example of another embodiment of the present disclosure. As shown in FIG. 3A, in the present embodiment, a display substrate 200 includes a transparent region 201 and a pixel display region 202 surrounding at least a portion of the transparent region 201. The display substrate 200 includes a base substrate 210 and a first optical layer 220 located on the base substrate 210. The first optical layer 220 is located within the pixel display region 202. A portion of the first optical layer 220 close to the transparent region 201 includes a first light ray deflection part 221, and a thickness of the first light ray deflection part 221 gradually increases in a direction parallel to the base substrate 210 and from a position away from the transparent region 201 to a position close to the transparent region 201. The first light ray deflection part 221 is configured to deflect image light of the pixel display region 202 around the transparent region 201 toward the transparent region 201 for display in the transparent region 201.

For example, the display substrate 200 further includes a pixel unit 230 disposed on the base substrate 210 and located in the pixel display region 202. The first optical layer 220 is located at a light exit side of the pixel unit 230.

The present embodiment takes an example that the first light ray deflection part is an inclination part having a gradually increased thickness in the direction parallel to the base substrate and from the position away from the transparent region to the position close to the transparent region, but is not limited thereto, and the first light ray deflection part also may be other components that can deflect light.

For example, as shown in FIG. 3A, a side of the first light ray deflection part 221 away from the pixel unit 230 is filled with a medium 222 having a smaller refractive index than that of the first light ray deflection part 221. For example, the medium 222 may be air, or other medium having a smaller refractive index than that of the first light ray deflection part 221, which is not limited in the present embodiment.

In the display substrate provided in the present embodiment, the position of the first optical layer disposed at the light exit side of the pixel unit from a position away from the transparent region to a position close to the transparent region includes the first light ray deflection part, and the image light displayed in the pixel display region after being incident on the first light ray deflection part, is deflected toward the transparent region for displaying in the transparent region. That is to say, an original light path of the image light emitted from the pixel unit is changed after the image light passing through the first light ray deflection part of the first optical layer, and at least a portion of the image light whose light path is changed exits from the transparent region, and the display integrity of the entire display substrate is realized by displaying at a position of an original visual black spot.

For example, the display substrate in this example is an array substrate of an organic light emitting diode, the pixel unit 230 includes a light emitting layer (not shown), and light emitted by a portion of the light emitting layer close to the transparent region exits from the transparent region after passing through the first light ray deflection part, i.e., the light emitted by the portion of the light emitting layer close to the transparent region is changed in light path after passing through the first light ray deflection part, and deflected toward the transparent region for displaying in the transparent region.

For example, the display substrate further includes an encapsulation layer between the first optical layer and the light emitting layer. The encapsulation layer is used to encapsulate the light emitting layer and prevent film layers such as the light emitting layer and the like from being eroded by external water and oxygen. In the present embodiment of the present disclosure, the original fabrication process of the array substrate of the original organic light emitting diode is not changed, and the first optical layer is added after the packaging of the general array substrate including the transparent region is completed, thereby facilitating the fabrication.

A fabrication method of the first optical layer in the present embodiment can be the same as the fabrication method of the first optical layer in the embodiment shown in FIG. 1A-FIG. 2, and more details are not described herein.

For example, as shown in FIG. 3A, an inclination plane 2210 of the first light ray deflection part 221 may have a straight line shape in a cross-section taken by a plane perpendicular to the base substrate 210 (taking a plane parallel to XY plane as an example in the figure).

Figure 3B:
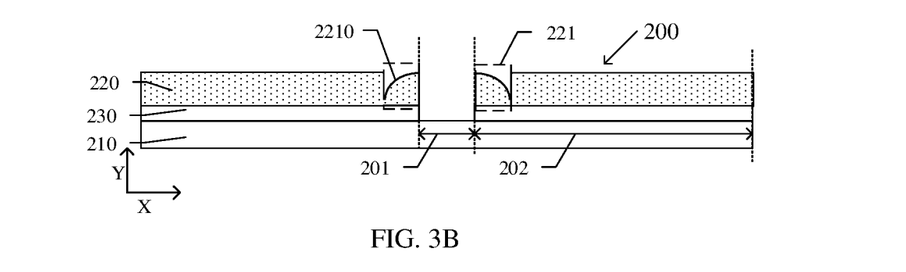
FIG. 3B is a partial cross-section structural diagram of a display substrate provided by another example of another embodiment of the present disclosure.

FIG. 3B is a partial cross-section structural diagram of a display substrate provided by another example of the present embodiment. As shown in FIG. 3B, the inclination plane 2210 of the first light ray deflection part 221 may also have a curve-line shape in a cross-section taken by a plane perpendicular to the base substrate 210 (taking a plane parallel to the XY plane as an example in the figure), in which the curve bends toward a side away from the transparent region 201, meanwhile the inclination plane 2210 is an arc-shaped plane. The inclination plane of the first light ray deflection part is designed as an arc-shaped plane, and the arc-shaped plane bends toward a side close to the transparent region, and it is possible to make the image light emitted from the inclination plane distribute homogeneously.

In this example, the base substrate 210 is taken as a transparent substrate for example, but is not limited thereto, the base substrate may also be an opaque substrate, the current base substrate is required to dispose a through-hole at a position opposite to the transparent region, in order to guarantee a transmission of the transparent region.

Figure 3C:
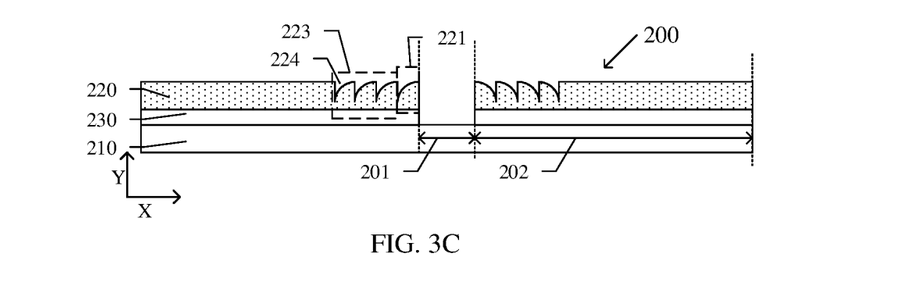
FIG. 3C is a partial cross-section structural diagram of a display substrate provided by another example of another embodiment of the present disclosure.

FIG. 3C is a partial cross-section structural diagram of a display substrate provided by another example of the present embodiment. As shown in FIG. 3C, the first optical layer 220 further includes at least one second light ray deflection part 223 located at a side of the first light ray deflection part 221 away from the transparent region 201. In a case where the number of the second light ray deflection part 223 is multiple, a thickness of each second light ray deflection part 223 gradually increases in the direction parallel to the base substrate 210 and from the position away from the transparent region 201 to the position close to the transparent region 201, and a side of the second light ray deflection part 223 away from the pixel unit 230 is filled with a medium 224 having a smaller refractive index than that of the second light ray deflection part 223.

For example, the medium 224 may be air or other materials having a smaller refractive index than that of the second light deflecting portion 223, which is not limited in the present embodiment.

For example, as shown in FIG. 3C, the cross-sectional shape of the second light ray deflection part 223 taken by a plane perpendicular to the base substrate 210 is the same as a cross-sectional shape of the first light ray deflection part taken by the above plane, for facilitating fabrication.

In this example, a propagation direction of image light emitted by the pixel unit is also changed and deflected to a side from the position away from the transparent region to the position close to the transparent region after the image light passing through the second light ray deflection part, and thereby effectively reducing the display difference between the pixel display region and the transparent region.

For example, when the image light emitted by the pixel unit exits from the transparent region after passing through the second light ray deflection part close to the first light ray deflection part, the display integrity of the display substrate can be realized under a combined action of the first light ray deflection part and at least a portion of the second light ray deflection part. In this case, only a thickness of the first optical layer is set to be relatively small, the display integrity of the display substrate can be satisfied.

For example, the example takes a case that both of the inclination plane of the first light ray deflection part and the inclination plane of the second light ray deflection part have a curve-line shape in a cross-section taken by the plane perpendicular to the base substrate, so that the uniformity of emitted light is higher and the display difference between the pixel display region and the transparent region is further reduced.

A recess is included between the first light ray deflection part and a portion of the first optical layer other than the first light ray deflection part in the present embodiment, and the recess is filled with a medium having a refractive index smaller than that of the first light ray deflection part, such as air, in order to ensure that the image light emitted from the first light ray deflection part can exit from the transparent region to achieve the integrity of the display of the substrate display.

A recess is also included between the second light ray deflection part and a portion of the first optical layer other than the second light ray deflection part in the present embodiment, and the recess is filled with a medium having a refractive index smaller than that of the second light ray deflection part, such as air, in order to ensure that the image light emitted from the second light ray deflection part can deflect toward a direction close to the transparent region to achieve a purpose of reducing the display difference between the pixel display region and the transparent region.

Figure 4:
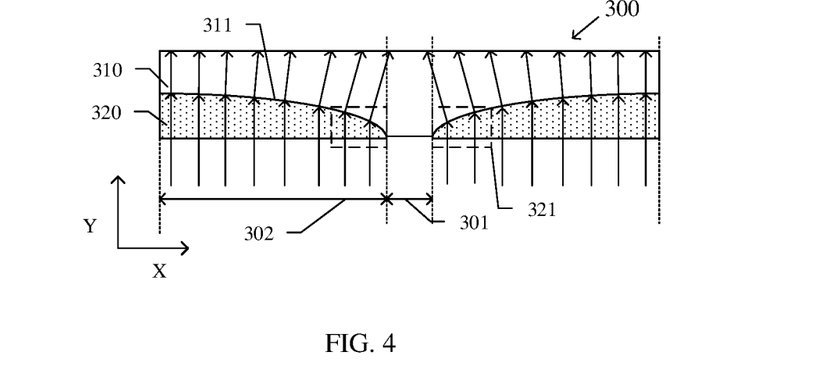
FIG. 4 is a partial cross-section structural diagram of a display substrate provided by another embodiment of the present disclosure.

FIG. 4 is a partial cross-section structural diagram of a display substrate provided by another embodiment of the present disclosure. As shown in FIG. 4, a display substrate provided in the present embodiment may be a cover glass. In the present embodiment, the display substrate 300 includes a transparent region 301 and a pixel display region 302 surrounding at least a portion of the transparent region 301. The display substrate 300 includes a base substrate 310 and a first optical layer 320 located on the base substrate 310, the first optical layer 320 being located within the pixel display region 302. The base substrate 310 includes a groove 311 in which the first optical layer 320 is located; and a refractive index of the first optical layer 320 is smaller than that of the base substrate 310. A portion of the first optical layer 320 close to the transparent region 301 includes a first light ray deflection part 321, and a thickness of the first light ray deflection part 321 gradually becomes small in a direction parallel to the base substrate 310 and from a position away from the transparent region 301 to a position close to the transparent region 301, the first light ray deflection part 321 is configured to deflect image light of the pixel display region 302 around the transparent region 301 toward the transparent region 301 for displaying in the transparent region 301. Herein, the pixel display region refers to a region directly facing with the region of the array substrate provided with the pixel unit in a direction perpendicular to the cover glass. That is to say, assuming that the first optical layer is not disposed on the cover glass, the light emitted from the pixel unit of the array substrate exits only from the pixel display region of the cover glass, and no light exits from the transparent region, and no image is displayed on the transparent region, thereby generating visually black spots.

It should be noted that the shape and characteristic of the first optical layer in the present embodiment are the same as those of the first optical layer shown in FIG. 1A and FIG. 2, and details are not described herein.

In the present embodiment, a first optical layer having a refractive index smaller than that of the base substrate is disposed on the base substrate, and a portion of the first optical layer close to the transparent region includes a first light ray deflection part, so that an image can be displayed in the transparent region to maintain the display integrity of the entire display substrate.

It should be noted that the first optical layer in the present embodiment is closer to the pixel unit regarding the base substrate, that is to say, the image light emitted from the pixel unit firstly passes through the first optical layer and then exits through the base substrate.

For example, the cover glass in the present embodiment can be applied to a display device such as an organic light emitting diode display device or a liquid crystal display device, etc., and any product or component including the display device and having the display function, such as, a television, a digital camera, a cell phone, a watch, a tablet computer, a notebook computer, a navigator, and the like, but the present embodiment is not limited thereto.

For example, a process of fabricating the cover glass in the embodiment can includes: patterning a position of the base substrate corresponding to the pixel display region to form a groove, i.e., patterning the base substrate so that at least a portion of the base substrate close to the transparent region has a thickness gradually increasing in a direction parallel to the substrate and from a position away from the transparent region to a position close to the transparent region; then forming a first optical layer in the groove (pixel display region) of the base substrate.

Another embodiment of the present disclosure provides a display panel including the display substrate in any one of the embodiments as described above.

Figure 5A:
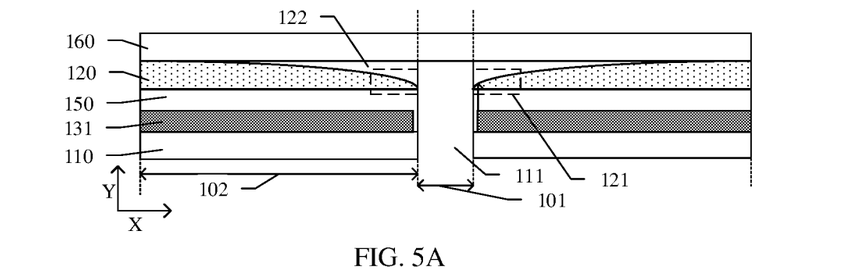
FIG. 5A is a partial cross-section structural diagram of a display panel provided by an example of another embodiment of the present disclosure.

FIG. 5A is a partial cross-section structural diagram of a display panel provided by an example of another embodiment of the present disclosure. FIG. 5A describes the display substrate as the display substrate shown in FIG. 2 as an example, but is not limited thereto. The display substrate may also be a display substrate as shown in any one of the other examples described above.

As shown in FIG. 5A, a position of the display panel directly facing with the transparent region 101 is transparent in a direction perpendicular to the base substrate 110.

For example, as shown in FIG. 5A, the display panel in this example is an organic light emitting diode display panel, and no light emitting layer is disposed at the position of the display panel directly opposite to the transparent region, i.e., the light emitting layer is only located in the pixel display region. Assuming that the first optical layer and the second optical layer are not provided, the light emitted by the light emitting layer exits only from the pixel display region, and at this time, no image light exits from the transparent region, which results in a visually black spot. Thereby, an image can be displayed in the transparent region by means of additionally providing the first optical layer and the second optical layer to maintain the display integrity of the entire display substrate. The present embodiment is not limited thereto. By taking the display substrate shown in FIG. 3C as an example, an image can be displayed in the transparent region by additionally providing the first optical layer, to maintain display integrity of the entire display substrate.

For example, the display panel further includes a cover glass 160 on a display side of the display substrate, and the cover glass 160 located in the transparent area 101 is a window of the display panel, and external ambient light can enter the display panel through the window, and in turn enter the camera module structure subsequently disposed.

In the present embodiment, the base substrate 110 includes a through hole 111 as an example. After the through hole 111 is fabricated in the base substrate 110 of the display substrate, the cover glass 160 is attached to the first optical layer 120.

Figure 5B:
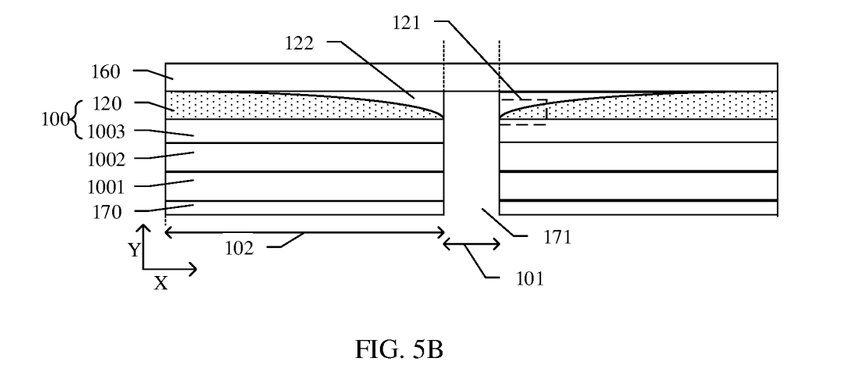
FIG. 5B is a partial cross-section structural diagram of a display panel provided by another example of another embodiment of the present disclosure.

For example, FIG. 5B is a partial cross-section structural diagram of a display panel provided by another example of the present embodiment. As shown in FIG. 5B, the display panel in this example is a liquid crystal display panel, and the display panel also includes a backlight source 170, a first optical layer 120 is located at a light exit side of the backlight source 170, and light emitted by the backlight source 170 does not pass through the transparent region 101. That is to say, the light emitted from the backlight source 170 is incident only on the pixel display region 102.

For example, as shown in FIG. 5B, the display panel in this example includes an array substrate 1001, a liquid crystal layer 1002, and a color filter substrate 100 on the light exit side of the backlight source 170. This example takes an example that the first optical layer 120 is disposed on a light exit side of a color film layer 1003 of the color filter substrate 100, but is not limited thereto, the first optical layer may be disposed on the array substrate.

For example, as shown in FIG. 5B, this example takes an example that a position of the backlight source 170 directly facing with the transparent region 101 is a backlight source through-hole 171, so that the light emitted from the backlight source 170 is only incident on the pixel display region 102. And this example takes an example that a position of the array substrate 1001, the liquid crystal layer 1002, and the color filter substrate 100 directly facing with the transparent region 101 is also a through-hole. The present example is not limited thereto, as long as the position of the array substrate 1001, the liquid crystal layer 1002, and the color filter substrate 100 directly facing with the transparent region 101 is transparent.

Figure 5C:
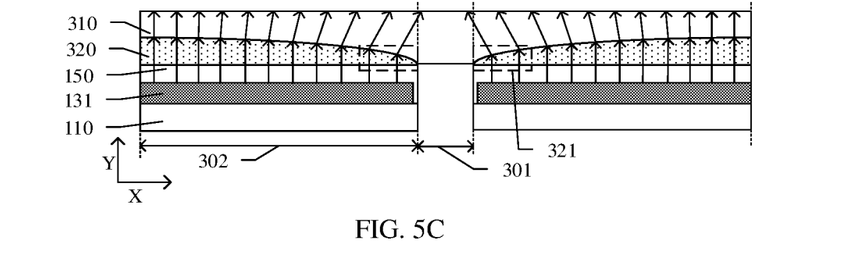
FIG. 5C is a partial cross-section structural diagram of a display panel provided by another example of another embodiment of the present disclosure.

For example, FIG. 5C is a partial cross-section structural diagram of a display substrate provided by another example of the present embodiment. As shown in FIG. 5C, the display substrate included in the display panel in this example is the display substrate shown in FIG. 4. The display substrate in this example is a cover glass of the display panel. This example can be easy to fabricate by only modifying the cover glass.

Figure 6:
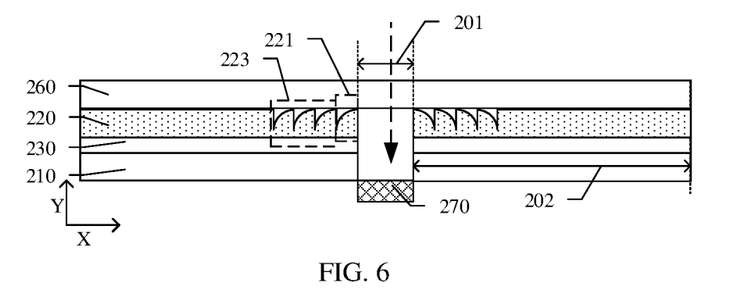
FIG. 6 is a partial cross-section structural diagram of a display device provided by another embodiment of the present disclosure.

Another embodiment of the present disclosure provides a display device including the display panel in any one of the embodiments as described above. FIG. 6 is a partial cross-section structural diagram of a display device provided by the present embodiment, and FIG. 6 schematically shows a display panel as the display panel including the display substrate shown in FIG. 3C, but is not limited thereto, and may also be a display panel including the display substrate in any one of examples as described above. As shown in FIG. 6, the display device includes a functional component 270 located in the transparent region 201 and at a side opposite to a light exit side of the display panel. External ambient light can be incident into the functional component 270 through the transparent region 201.

For example, the functional component 270 is located at a side of the pixel unit 230 away from the first optical layer 220, and an orthographic projection of the functional component 270 on the cover glass 260 does not overlap with an orthographic projection of the first optical layer 220 on the cover glass 260.

For example, upon the base substrate being a transparent substrate, a position of the base substrate directly facing with the transparent region may not be provided with a through-hole, and at this case, the functional component is located at a side of the base substrate away from the cover glass.

For example, FIG. 6 takes the base substrate including a through-hole as an example, and the functional component may be inserted into the through-hole of the base substrate, but also may not be inserted into the through-hole, i.e., located at the side of the base substrate away from the cover glass, and the present embodiment is not limited thereto.

For example, the functional component 270 includes at least one selected from the group consisting of a camera module (e.g., a front camera module), a 3D structured light module (e.g., a 3D structured light sensor), a time-of-flight 3D imaging module (e.g., a time-of-flight sensor), an infrared sensing module (e.g., an infrared sensing sensor) and the like.

For example, a front camera module is usually enabled during a user's selfie or video call, and the pixel display region of the display device displays the image obtained by the selfie for watching by the user. The front camera module for example includes a camera, an image sensor, an image processing chip and the like. An optical image of scenery generated by a lens is projected to a surface of the image sensor surface (the image sensor includes both CCD and CMOS) and converted into electrical signals, which are changed into digital image signals by analog-to-digital conversion of the image processing chip, and then sent into a processor for processing, to output the image of the scenery on the display screen.

For example, the 3D structured light sensor and Time of Flight (ToF) sensor can be used for face recognition to unlock the display device.

For example, the functional component 270 may include only a camera module to realize a selfie or video call. For example, the functional component 270 may also include a 3D structured light module or a time-of-flight 3D imaging module to realize face recognition unlocking, etc., and the present embodiment includes but is not limited thereto.

The display device provided by the embodiment of the present disclosure can display images in the transparent region, to maintain display integrity of the entire display device.

The following is to be noted:

(1) the accompanying drawings involve only the structure(s) in connection with the embodiment(s) of the present disclosure, and other structure(s) can be referred to in common design(s); and (2) in a case of no conflict, features in the same embodiment and different embodiments of the present disclosure can be combined with each other.

What have been described above are only exemplary implementations of the present disclosure, the protection scope of the present disclosure is not limited thereto, and the protection scope of the present disclosure should be based on the protection scope of the claims.

What is claimed is:

1. A display substrate, comprising a transparent region and a pixel display region surrounding at least a portion of the transparent region,
   the display substrate comprising a base substrate and a first optical layer located on the base substrate, the first optical layer being located within the pixel display region,
   wherein a portion of the first optical layer close to the transparent region comprises a first light ray deflection part, the first light ray deflection part is configured to deflect image light of the pixel display region around the transparent region toward the transparent region for displaying in the transparent region.

2. The display substrate according to claim 1, further comprising:
   a pixel unit, disposed on the base substrate and located in the pixel display region, the first optical layer being located at a light exit side of the pixel unit,
   wherein a thickness of the first light ray deflection part gradually increases in a direction parallel to the base substrate and from a position away from the transparent region to a position close to the transparent region, and a side of the first light ray deflection part away from the pixel unit is filled with a medium having a smaller refractive index than that of the first light ray deflection part.

3. The display substrate according to claim 2, wherein the first optical layer further comprises at least one second light ray deflection part located at a side of the first light ray deflection part away from the transparent region, and in the direction parallel to the base substrate and from the position away from the transparent region to the position close to the transparent region, a thickness of the second light ray deflection part gradually increases, and a side of the second light ray deflection part away from the pixel unit is filled with a medium having a smaller refractive index than that of the second light ray deflection part.

4. The display substrate according to claim 3, wherein a cross-sectional shape of the second light ray deflection part taken by a plane perpendicular to the base substrate is the same as a cross-sectional shape of the first light ray deflection part taken by the plane.

5. The display substrate according to claim 1, further comprising:
    a pixel unit, disposed on the base substrate and located in the pixel display region, the first optical layer being located at a light exit side of the pixel unit,
    wherein a thickness of the first light ray deflection part gradually decreases in a direction parallel to the base substrate and from a position away from the transparent region to a position close to the transparent region;
    the display substrate further comprises a second optical layer attached on a surface of a side of the first light ray deflection part away from the pixel unit, and a refractive index of the second optical layer is greater than that of the first light ray deflection part.

6. The display substrate according to claim 5, wherein a surface of a side of the second optical layer away from the first light ray deflection part is provided with a medium having a smaller refractive index than that of the second optical layer.

7. The display substrate according to claim 5, wherein a thickness of a portion of the first optical layer apart from the first light ray deflection part gradually decreases in the direction parallel to the base substrate and from the position away from the transparent region to the position close to the transparent region.

8. The display substrate according to claim 2, wherein a surface of the side of the first light ray deflection part away from the pixel unit has a straight-line or curved-line shape in a cross-section taken by a plane of the base substrate.

9. The display substrate according to claim 1, wherein a position of the base substrate directly facing with the transparent region in a direction perpendicular to the base substrate comprises a through-hole.

10. The display substrate according to claim 1, wherein the base substrate is a transparent substrate.

11. The display substrate according to claim 1, wherein the display substrate is an array substrate or a color filter substrate.

12. The display substrate according to claim 1, wherein the base substrate is a cover glass, the base substrate comprises a groove, and the first optical layer is located within the groove;
    a thickness of the first light ray deflection part gradually decreases in a direction parallel to the base substrate and from a position away from the transparent region to a position close to the transparent region;
    a refractive index of the base substrate is greater than that of the first light ray deflection part, and the base substrate located at a light exit side of the first optical layer.

13. The display substrate according to claim 12, wherein a surface of a side of the first optical layer away from the base substrate is flush with a surface of the base substrate.

14. A display panel, comprising:
    the display substrate according to claim 1,
    wherein a position of the display panel directly facing with the transparent region in a direction perpendicular to the base substrate is transparent.

15. A display device, comprising:
    the display panel according to claim 14, and
    a functional component located in the transparent region and located at a side opposite to a light exit side of the display panel.

16. The display device according to claim 15, wherein the functional component comprises at least one selected from the group consisting of a camera module, a 3D structured light module, a time-of-flight 3D imaging module, and an infrared sensing module.

* * * * *